(12) United States Patent
Lin et al.

(10) Patent No.: US 8,190,303 B2
(45) Date of Patent: May 29, 2012

(54) SYSTEMS AND METHODS TO DISSIPATE HEAT IN AN INFORMATION HANDLING SYSTEM

(75) Inventors: Chung-Hsiung Lin, Taipei (TW); Chien-Ting Lin, Taipei (TW)

(73) Assignee: Dell Products, LP, Round Rock, TX (US)

( * ) Notice: Subject to any disclaimer, the term of this patent is extended or adjusted under 35 U.S.C. 154(b) by 708 days.

(21) Appl. No.: 12/338,006

(22) Filed: Dec. 18, 2008

(65) Prior Publication Data

US 2010/0155047 A1 Jun. 24, 2010

(51) Int. Cl.
*G06F 19/00* (2011.01)
*G05D 23/00* (2006.01)
*F28F 27/00* (2006.01)

(52) U.S. Cl. ........ 700/300; 700/276; 700/277; 700/281; 700/299; 165/200; 165/288; 251/129.06; 310/326; 310/330; 310/349; 310/363; 361/689; 361/690; 361/699; 361/700

(58) Field of Classification Search .......... 700/276–277, 700/281, 299–300; 165/200, 288; 251/129.06; 310/326, 330, 349, 363
See application file for complete search history.

(56) References Cited

U.S. PATENT DOCUMENTS

| | | | | |
|---|---|---|---|---|
| 6,694,759 B1 * | 2/2004 | Bash et al. | | 62/180 |
| 6,979,050 B2 * | 12/2005 | Browne et al. | | 296/180.5 |
| 7,362,032 B2 * | 4/2008 | Pelrine et al. | | 310/309 |
| 7,676,280 B1 * | 3/2010 | Bash et al. | | 700/17 |
| 8,090,476 B2 * | 1/2012 | Dawson et al. | | 700/276 |
| 2003/0193777 A1 * | 10/2003 | Friedrich et al. | | 361/687 |
| 2004/0008853 A1 | 1/2004 | Pelrine et al. | | |
| 2004/0089010 A1 * | 5/2004 | Patel et al. | | 62/259.2 |
| 2004/0108479 A1 | 6/2004 | Garnier et al. | | |
| 2005/0168942 A1 * | 8/2005 | Steinbrecher | | 361/690 |
| 2005/0208888 A1 * | 9/2005 | Moore et al. | | 454/334 |
| 2005/0230546 A1 | 10/2005 | McKnight et al. | | |
| 2005/0279109 A1 | 12/2005 | Chrysler et al. | | |

(Continued)

OTHER PUBLICATIONS

Bar-Cohen, "electroactive Polymers (EAP) as actautors fro potential planetary mechanisms", 2004 , pp. 1-9.*

(Continued)

*Primary Examiner* — Albert Decady
*Assistant Examiner* — Olvin Lopez Alvarez
(74) *Attorney, Agent, or Firm* — Larson Newman, LLP

(57) ABSTRACT

In a particular embodiment, a system to dissipate heat in an information handling system includes a first heat-generating component adapted to process first data and a second heat-generating component adapted to process second data. The system also includes a cooling fluid guide including an electroactive material. The cooling fluid guide is adapted to change from a first shape to a second shape, in response to receiving a trigger voltage or in response to no longer receiving the trigger voltage. The system also includes a controller adapted to detect a data load processed at the second heat-generating component and, in response to detecting the data load, to cause the trigger voltage to be received at, or no longer received at, the cooling fluid guide. The cooling fluid guide is adapted to direct an increased portion of cooling fluid toward the first heat-generating component when the cooling fluid guide is in a form of the second shape, as compared to the first shape.

17 Claims, 10 Drawing Sheets

U.S. PATENT DOCUMENTS

| | | | |
|---|---|---|---|
| 2007/0125107 A1* | 6/2007 | Beam | 62/186 |
| 2007/0164641 A1* | 7/2007 | Pelrine et al. | 310/800 |
| 2008/0116764 A1 | 5/2008 | Heim | |
| 2008/0147363 A1* | 6/2008 | Dalton et al. | 703/5 |
| 2008/0154534 A1* | 6/2008 | Bash et al. | 702/130 |
| 2009/0234705 A1* | 9/2009 | Brunschwiler et al. | 705/10 |
| 2009/0265045 A1* | 10/2009 | Coxe, III | 700/300 |
| 2010/0030394 A1* | 2/2010 | Lewis et al. | 700/300 |
| 2010/0057259 A1* | 3/2010 | Dawson et al. | 700/278 |

OTHER PUBLICATIONS

Lenau, "dielectric elastomers", Feb. 2001, pp. 1.*

IBM, Dynamic Thermal Mapping and Trend Analysis as a Control Mechanism for HVAC Systems in Data centers, Mar. 27, 2006, pp. 3.*

Moore et al, "Data Center Workload Monitoring, Analysis, and Emulation", 2005, pp. 1-8.*

* cited by examiner

SYSTEMS AND METHODS TO DISSIPATE HEAT IN AN INFORMATION HANDLING SYSTEM

FIELD OF THE DISCLOSURE

This disclosure relates generally to systems and methods used by information handling systems, and more particularly to systems and methods to dissipate heat in information handling systems.

DESCRIPTION OF THE RELATED ART

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

BRIEF DESCRIPTION OF THE DRAWINGS

Skilled artisans appreciate that elements in the figures are illustrated for simplicity and clarity and have not necessarily been drawn to scale. For example, the dimensions of some of the elements in the figures may be exaggerated or minimized relative to other elements to help to improve understanding of embodiments of the invention. Embodiments incorporating teachings of the present disclosure are illustrated and described with respect to the drawings presented herein.

The use of the same reference symbols in different figures indicates similar or identical items.

DETAILED DESCRIPTION

Figure 1:
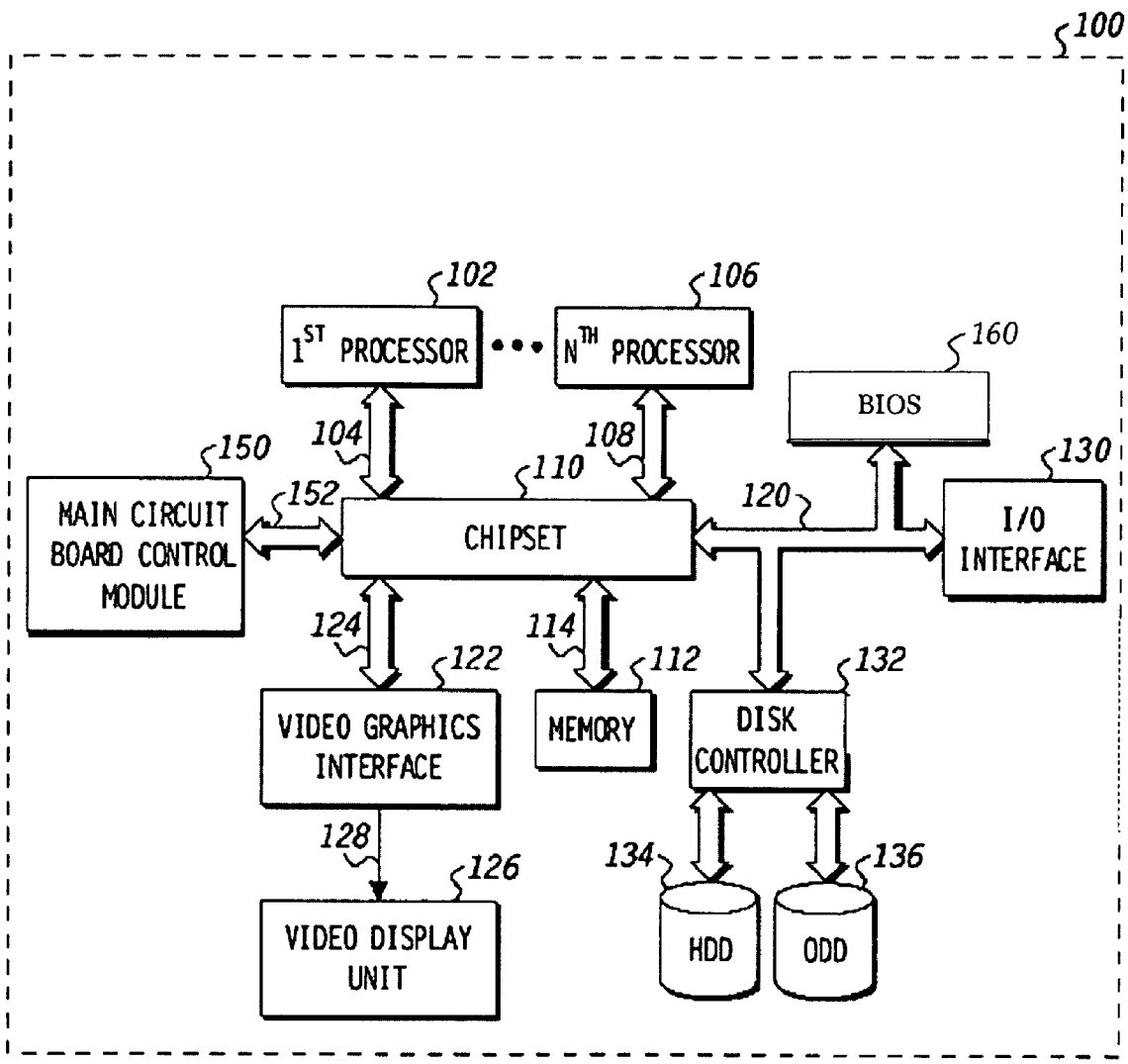
FIG. 1 is a block diagram illustrating an exemplary embodiment of an information handling system.

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. The teachings can also be utilized in other applications and with several different types of architectures such as distributed computing architectures, client/server architectures, or middleware server architectures and associated components.

For purposes of this disclosure, an information handling system can include any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device and can vary in size, shape, performance, functionality, and price. The information handling system can include memory (volatile (e.g. random access memory, etc.), nonvolatile (read only memory, flash memory etc.) or any combination thereof), one or more processing resources, such as a central processing unit (CPU), hardware or software control logic, or any combination thereof. Additional components of the information handling system can include one or more storage devices, one or more communications ports for communicating with external devices as well as various input and output (I/O) devices, such as a keyboard, a mouse, a video display, or any combination thereof. The information handling system can also include one or more buses operable to transmit communications between the various hardware components.

Although referred to as a "device," the device may be configured as hardware, firmware, software, or any combination thereof. For example, the device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). Similarly, the device could be firmware (such as any software running on an embedded device, a Pentium class or PowerPC™ brand processor, or other such device) or software (such as any software capable of operating in the relevant environment). The device could also be a combination of any of the foregoing examples of hardware, firmware, or software.

Devices or programs that are in communication with one another need not be in continuous communication with each other unless expressly specified otherwise. In addition, devices or programs that are in communication with one another may communicate directly or indirectly through one or more intermediaries.

Embodiments discussed below describe, in part, distributed computing solutions that manage all or part of a communicative interaction between network elements. In this context, a communicative interaction may be intending to send information, sending information, requesting information, receiving information, receiving a request for information, or any combination thereof. As such, a communicative interaction could be unidirectional, bi-directional, multi-directional, or any combination thereof. In some circumstances, a communicative interaction could be relatively complex and involve two or more network elements. For example, a communicative interaction may be "a conversation" or series of related communications between a client and a server—each network element sending and receiving information to and from the other. Whatever form the communicative interaction takes, the network elements involved need not take any specific form. A network element may be a node, a piece of hardware, software, firmware, middleware, some other component of a computing system, or any combination thereof.

In the description below, a flow-charted technique may be described in a series of sequential actions. The sequence of the actions and the party performing the steps may be freely changed without departing from the scope of the teachings. Actions may be added, deleted, or altered in several ways. Similarly, the actions may be re-ordered or looped. Further, although processes, methods, algorithms or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the computing, electronics, and software arts.

An information handling system and method of using it are described below. An exemplary, non-limiting system description is described before addressing methods of using it. Some of the functionality of modules within the system is described with the system. The utility of the system and its modules will become more apparent with the description of the methods that follow the description of the system and modules.

FIG. 1 illustrates a functional block diagram of an exemplary embodiment of an information handling system, generally designated at 100. In one form, the information handling system 100 can be a computer system such as a server. Alternatively, the information handling system 100 can include a desktop computer, a laptop computer, another similar computer, a rack of computers (e.g., networked servers), or any combination thereof. Other implementations can be used. After reading this specification, skilled artisans will appreciate that the information handling system can be configured to their particular needs or desires.

As illustrated in FIG. 1, the information handling system 100 can include a first physical processor 102 coupled to a first host bus 104 and can further include additional processors generally designated as $n^{th}$ physical processor 106 coupled to a second host bus 108. The first physical processor 102 can be coupled to a chipset 110 via the first host bus 104. Further, the $n^{th}$ physical processor 106 can be coupled to the chipset 110 via the second host bus 108. The chipset 110 can support multiple processors and can allow for simultaneous processing of multiple processors and support the exchange of information within information handling system 100 during multiple processing operations.

According to one aspect, the chipset 110 can be referred to as a memory hub or a memory controller. For example, the chipset 110 can include an Accelerated Hub Architecture (AHA) that uses a dedicated bus to transfer data between first physical processor 102 and the $n^{th}$ physical processor 106. For example, the chipset 110 including an AHA enabled-chipset can include a memory controller hub and an input/output (I/O) controller hub. As a memory controller hub, the chipset 110 can function to provide access to first physical processor 102 using first bus 104 and $n^{th}$ physical processor 106 using the second host bus 108. The chipset 110 can also provide a memory interface for accessing memory 112 using a third host bus 114. In a particular embodiment, the host buses 104, 108, and 114 can be individual buses or part of the same bus. The chipset 110 can also provide bus control and can handle transfers between the host buses 104, 108, and 114.

According to another aspect, the chipset 110 can be generally considered an application specific chipset that provides connectivity to various buses, and integrates other system functions. For example, the chipset 110 can be provided using an Intel®-brand Hub Architecture (IHA) chipset also that can include two parts, a Graphics and AGP Memory Controller Hub (GMCH) and an I/O Controller Hub (ICH). For example, an Intel 820E, an 815E chipset, or any combination thereof, available from the Intel Corporation of Santa Clara, Calif., can provide at least a portion of the chipset 110. The chipset 110 can also be packaged as an application specific integrated circuit (ASIC).

The information handling system 100 can also include a video graphics interface 122 that can be coupled to the chipset 110 using fourth host bus 124. In one form, the video graphics interface 122 can be an Accelerated Graphics Port (AGP) interface to display content within a video display unit 126. Other graphics interfaces may also be used. The video graphics interface 122 can provide a video display output 128 to the video display unit 126. The video display unit 126 can include one or more types of video displays such as a flat panel display (FPD) or other type of display device.

The information handling system 100 can also include an I/O interface 130 that can be connected via an I/O bus 120 to the chipset 110. The I/O bus 120 and the I/O interface 130 can include industry standard buses or proprietary buses and respective interfaces or controllers. The I/O bus 120 can also include a Peripheral Component Interconnect (PCI) bus or a high speed PCI-Express bus. In one embodiment, a PCI bus can be operated at approximately 66 Mhz and a PCI-Express bus can be operated at approximately 128 Mhz. PCI buses and PCI-Express buses can be provided to comply with industry standards for connecting and communicating between various PCI-enabled hardware devices. Other buses can also be provided in association with, or independent of, the I/O host bus 120 including other industry standard buses or proprietary buses, such as Industry Standard Architecture (ISA), Small Computer Serial Interface (SCSI), Inter-Integrated Circuit ($I^2C$), System Packet Interface (SPI), or Universal Serial buses (USBs).

In an alternate embodiment, the chipset 110 can be a chipset employing a Northbridge/Southbridge chipset configuration (not illustrated). For example, a Northbridge portion of the chipset 110 can communicate with the first physical processor 102 and can control interaction with the memory 112, the fourth bus 120 operable as a PCI bus, and activities for the video graphics interface 122. The Northbridge portion can also communicate with the first physical processor 102 using first bus 104 and the second bus 108 coupled to the $n^{th}$ physical processor 106. The chipset 110 can also include a Southbridge portion (not illustrated) of the chipset 110 and can handle I/O functions of the chipset 110. The Southbridge portion can manage the basic forms of I/O such as USB, serial I/O, audio outputs, Integrated Drive Electronics (IDE), and ISA I/O for the information handling system 100.

The information handling system 100 can further include a disk controller 132 coupled to the fourth bus 120. The disk controller 132 can be used to connect one or more disk drives such as a hard disk drive (HDD) 134 and an optical disk drive (ODD) 136 such as a Read/Write Compact Disk (R/W-CD), a Read/Write Digital Video Disk (R/W-DVD), a Read/Write mini Digital Video Disk (R/W mini-DVD), or other type of optical disk drive.

The information handling system 100 can further include main circuit board control module 150 that can be coupled to the chipset 110 via a system communication bus 152, such as a control bus. The main circuit board control module 150 may reside on a main circuit board, such as a baseboard, a motherboard, or the like. Although not illustrated, other components, such as the processors (1st processor 102 through the $n^{th}$ processor 106), the video display unit 126, the video graphic interface 122, the memory 112, and the disk controller 132 can be coupled to the main circuit board control module 150. Commands, communications, or other signals may be sent to or received from the main circuit board control module 150 by any one or combination of components previously described. The main circuit board control module 150 of an integrated circuit or a chip set within the information handling system 100.

The information handling system 100 can also include basic input/output system (BIOS) module 160 that can be coupled to the I/O bus 120. The BIOS module 160 is operable to detect and identify components within the information handling system 100 and to provide the appropriate drivers for those components. The BIOS module 160 can be operable during a boot sequence and provide information needed to properly boot the information handling system 100 before, during, and after an operating system for the information handling system 100 is launched. The BIOS module 160 can be in the form of hardware, software, firmware, or any combination thereof. The BIOS module 160 may be a standalone integrated circuit or chip set or can be shared within other functions within an integrated circuit or chip set.

In a particular embodiment, the functions described herein can be in machine-executable code that is embedded within a tangible medium, wherein the code includes instructions for carrying out methods to achieve the desired functionality. After reading this specification, skilled artisans will appreciate that other architectures can be used. Functionality described herein may be located within one module may be combined with a different module. Further, functions of different modules may be partitioned in a different manner than illustrated or described. Other configurations can alternatively be used.

Figure 2:
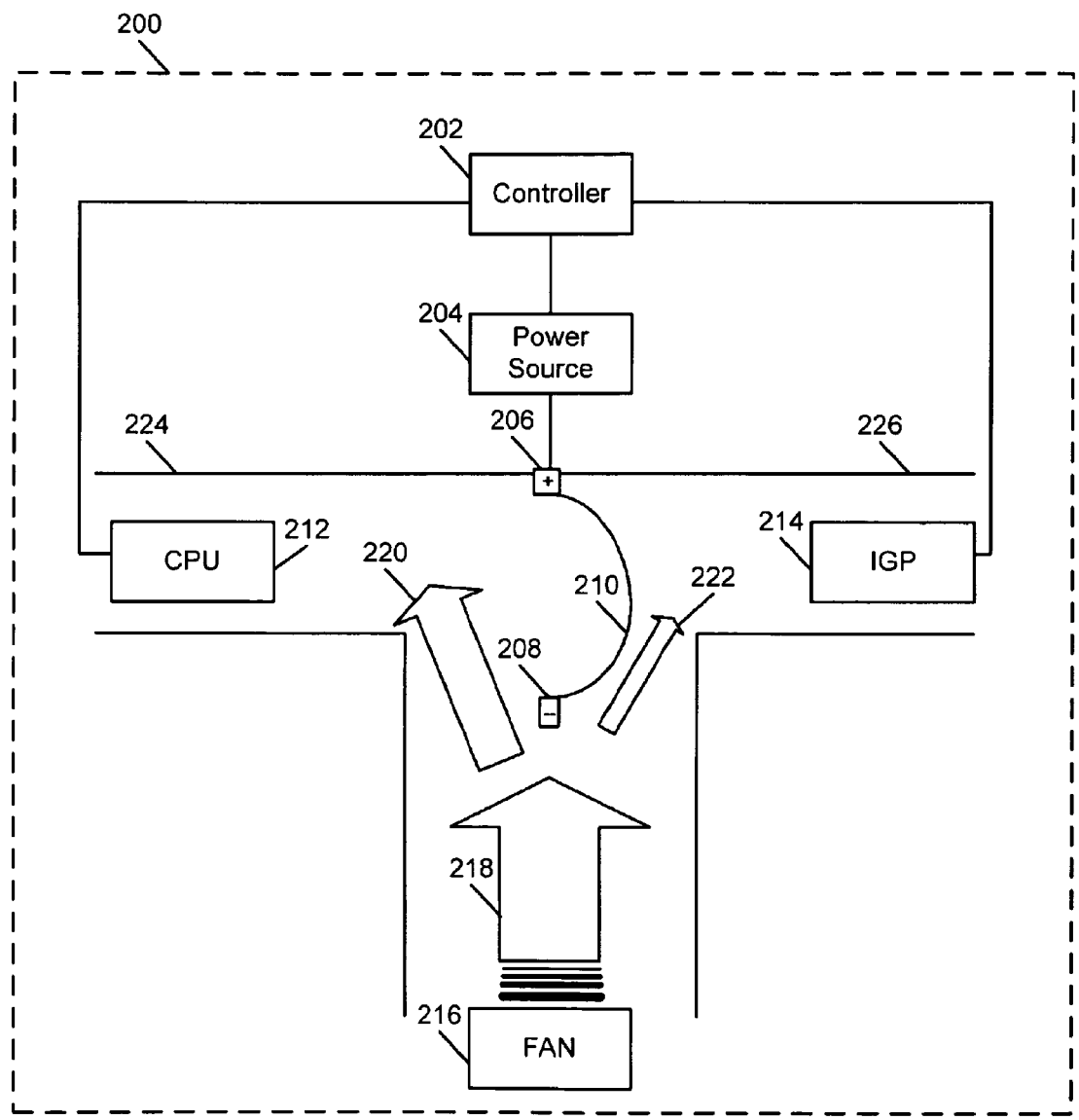
FIG. 2 is a block diagram illustrating a particular embodiment of a system to dissipate heat in an information handling system.

FIG. 2 illustrates a particular embodiment of a system to dissipate heat in an information handling system 200, such as the information handling system 100 illustrated in FIG. 1. The system includes a controller 202 coupled to a power source 204. The power source 204 is adapted to supply an electrical voltage to a cooling fluid guide 210 via an electrode 206. The cooling fluid guide 210 includes a flexible electroactive material, such as an electroactive polymer. In one embodiment, the cooling fluid guide 210 can also be coupled to another electrode 208. For example, the electrode 206 can be a positive (or power) electrode, and the other electrode 208 can be a negative (or ground) electrode, such that an electrical voltage difference can be created between the electrodes 206 and 208.

The controller 202 is also coupled to a heat-generating component of the information handling system 200, such as a central processing unit (CPU) 212. The controller 202 can be coupled to another heat-generating component of the information handling system 200, such as an integrated graphics processor (IGP) 214. The information handling system 200 also includes a cooling fluid source adapted to drive cooling fluid toward the heat-generating components 212 and 214 of the information handling system 200. The cooling fluid can include a gas, a liquid, a gel, or another fluid. In the embodiment illustrated in FIG. 2, the cooling fluid source is a fan 216 adapted to drive air 218 toward the heat-generating components 212 and 214. In other embodiments, the cooling fluid source can also be adapted to emit or generate the cooling fluid. For example, the cooling fluid source could include a cooling fluid reservoir and a pump adapted to drive the cooling fluid.

As illustrated in FIG. 2, the cooling fluid guide 210 can partially separate a channel 224 from another channel 226.

The channel 224 is adapted to conduct cooling fluid toward the CPU 212, and the other channel 226 is adapted to conduct cooling fluid toward the IGP 214. In one embodiment, the cooling fluid source, such as the fan 216, can be adapted to drive a substantially constant amount of cooling fluid, such as the air 218, and the cooling fluid guide 210 can divide the substantially constant amount of air 218 between the channel 224 and the other channel 226 based on the shape of the cooling fluid guide 210.

In an illustrative embodiment, the cooling fluid guide 210 can be in a form of a shape, as illustrated in FIG. 2, in which a portion 220 of the air 218 that is directed toward the CPU 212 is larger than another portion 222 of the air 218 that is directed toward the IGP 214. The controller 202 is adapted to detect a data load at the IGP 214. The controller 202 can also be adapted to determine whether the data load processed at the IGP 214 (for example, an average data load processed over a time period) exceeds a threshold, such as zero bytes of data processed per second or another threshold number of bytes of data processed per second. Those skilled in the art will recognize that measures other than bytes processed per second can be used to refer to a data load.

In response to detecting that a data load is processed at the IGP 214, or determining that the data load processed at the IGP 214 exceeds a threshold, the controller 202 is adapted to cause a trigger voltage to be received, or no longer received, at the cooling fluid guide 210. For example, the controller 202 can be adapted to signal the power source 204 to supply a trigger voltage to the cooling fluid guide 210, such as by creating an electrical voltage difference between the electrode 206 and the other electrode 208. In another embodiment, the controller 202 can be adapted to signal the power source 204 to cease supplying a trigger voltage to the cooling fluid guide 210. In another embodiment, the controller 202 can cause a switch (not shown) or other circuitry to allow the trigger voltage emitted by the power source 204 to be received at the cooling fluid guide 210.

Figure 3:
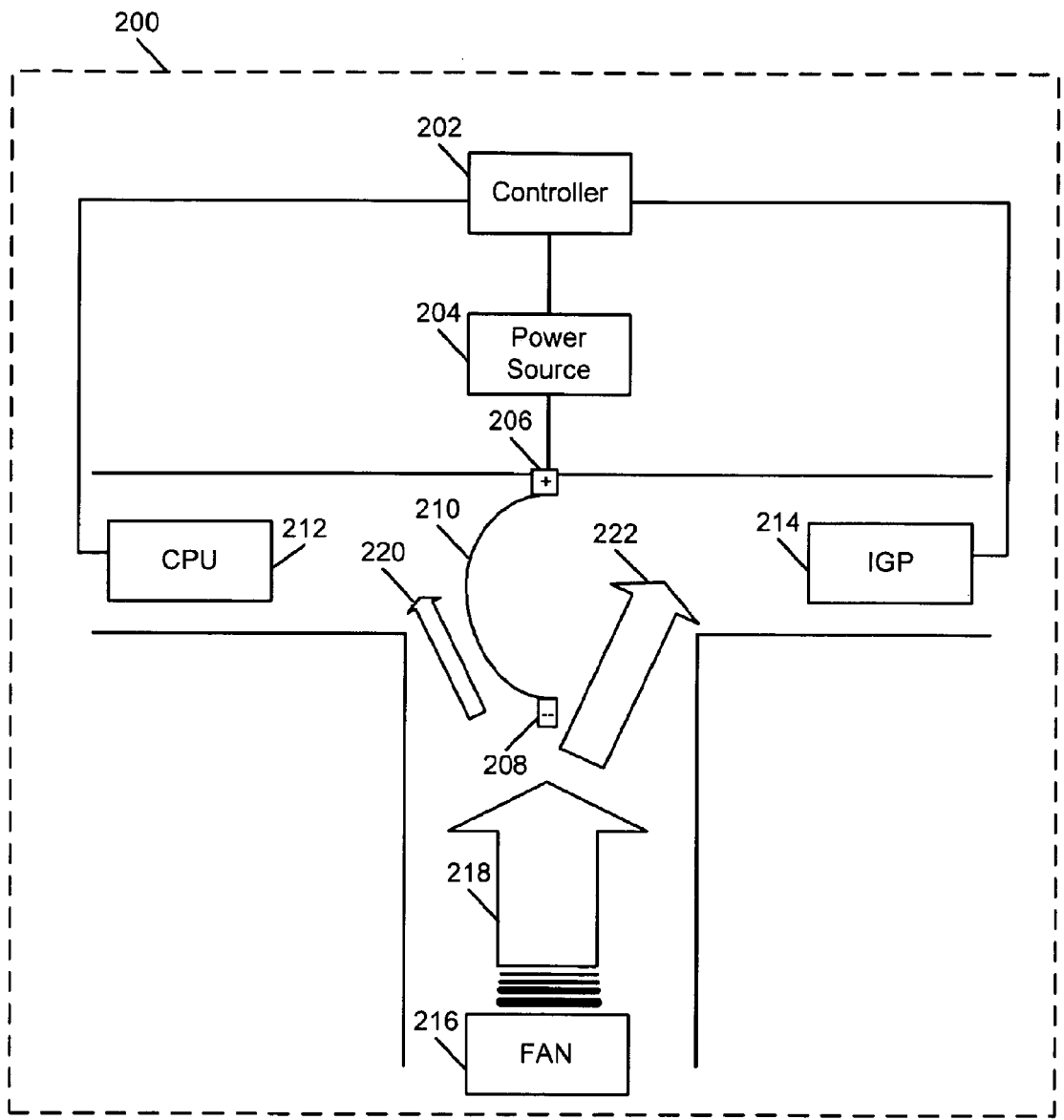
FIG. 3 is a block diagram illustrating another particular embodiment of a system to dissipate heat in an information handling system.

The cooling fluid guide 210 is adapted to change from the shape illustrated in FIG. 2 to another shape, as illustrated in FIG. 3, in response to receiving, or no longer receiving, the trigger voltage. The portion 222 of the air 218 directed toward the IGP 214 is increased when the cooling fluid guide 210 is in a form of the other shape illustrated in FIG. 3. In the embodiment illustrated in FIG. 3, the portion 222 of the air 218 directed toward the IGP 214 becomes larger than the portion 220 of the air 218 directed toward the CPU 214, when the cooling fluid guide 210 is in the form of the other shape. In other embodiments, the portion 222 of the air 218 directed toward the IGP 214 can be increased, but can still be smaller than the portion 220 of the air 218 directed toward the CPU 212, when the cooling fluid guide 210 is in the form of the other shape.

The controller 202 can be adapted to determine whether data is no longer processed at the IGP 214 or whether a data load processed at the IGP 214 is at or below the threshold. Where the controller 202 is adapted to cause the cooling fluid guide 210 to receive the trigger voltage when the data load at the IGP 214 is present or is above the threshold data load, the controller 202 can be adapted to cause the cooling fluid guide 210 to no longer receive the trigger voltage (e.g., by signaling the power source 204 to stop supplying the trigger voltage to the cooling fluid guide 210 or by causing a switch or other circuitry between the power source 204 and the cooling fluid guide 210 to be closed or otherwise altered to prevent the cooling fluid guide 210 from receiving the trigger voltage) when the controller 202 determines that the data load at the IGP 214 is no longer present or is at or below the threshold data load. Alternatively, where the controller 202 is adapted to cause the cooling fluid guide 210 to stop receiving the trigger voltage when the data load at the IGP 214 is present or is above the threshold data load, the controller 202 can be adapted to cause the cooling fluid guide 210 to receive the trigger voltage or another voltage when the controller 202 determines that the data load at the IGP 214 is no longer present or is at or below the threshold data load.

In one embodiment, the cooling fluid guide 210 can be adapted to return to the shape illustrated in FIG. 2 when the cooling fluid guide 210 no longer receives the trigger voltage. In another embodiment, the cooling fluid guide 210 can be adapted to return to the shape illustrated in FIG. 2 when the cooling fluid guide 210 receives the trigger voltage or another voltage.

In another illustrative embodiment, the CPU 212 can process a data load. The controller 202 can be adapted to detect another data load at the IGP 214 and to determine whether the data load processed at the CPU 212 is less than the other data load processed at the IGP 214. The controller 202 can cause the cooling fluid guide 210 to receive, or to no longer receive, the trigger voltage when the controller 202 determines that the data load processed at the CPU 212 is less than the other data load processed at the IGP 214. Conversely, when the controller 202 determines that the data load processed at the CPU 212 equals or exceeds the other data load processed at the IGP 214, the controller 202 can be adapted to cause the trigger voltage to no longer be received at the cooling fluid guide 210, or to cause the trigger voltage or another voltage to be supplied to the cooling fluid guide 210.

The electroactive material included in the cooling fluid guide 210 can include an electroactive polymer (EAP), such as an electronic EAP (driven by an electric field), an ionic EAP (driven by movement of ions), or a combination thereof. In some embodiment, the electroactive material may include multiple electronic EAPs, multiple ionic EAPs, or a combination thereof. Examples of dielectric EAPs include electrorestrictive polymers, dielectric elastomers, electrostatic polymers, ferroelectric polymers, liquid crystal elastomers and piezoelectric polymers. Examples of ionic EAPs include conductive polymers, ionic polymer-metal composites, carbon nanotubes and responsive gels. Trigger voltages for EAPs can range from less than approximately 10 volts for some ionic EAPs to at least 100 volts per micrometer for some electronic EAPs.

Figure 4:
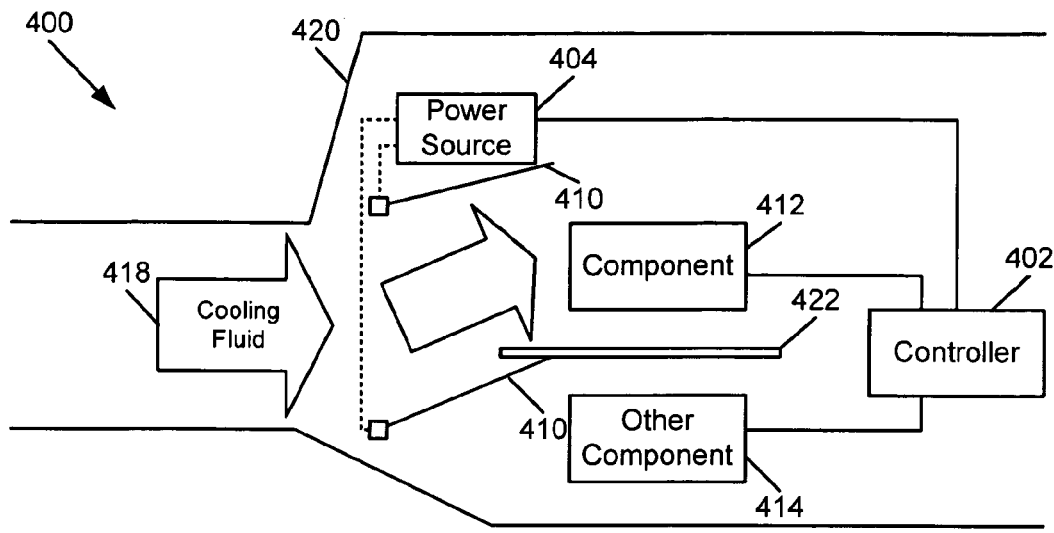
FIG. 4 is a block diagram illustrating a further particular embodiment of a system to dissipate heat in an information handling system.

FIG. 4 illustrates a further particular embodiment of a system 400 to dissipate heat in an information handling system. The system 400 includes a controller 402 coupled to a power source 404. The power source 404 is adapted to supply an electrical voltage to a plurality of electrodes, each of which is coupled to one of a plurality of cooling fluid guides 410. Each cooling fluid guide 410 is formed of a flexible electroactive material, such as an electroactive polymer. The controller 402 is also coupled to a heat-generating component of the information handling system, such as the component 412. The controller 402 can also be coupled to another heat-generating component of the information handling system, such the other component 414. The heat-generating components 412 and 414 can include, for example, a data processing component (such as a central processing unit, video graphics processor, or another data processing component), a power supply, a disk drive, another heat-generating component, or any combination thereof.

In an illustrative embodiment, the components 412 and 414 can be separated by a partition 422 that effectively divides a chamber 420 or other partially enclosed portion of the information handling system into a plurality of channels, such as a channel directed toward the component 412 and another channel directed toward the other component 414. The cooling fluid guides 410 can be in a form of a shape, as illustrated in FIG. 4, which directs the cooling fluid 418 toward the component 412.

The controller 402 can be adapted to signal the power source 404 to supply a trigger voltage to the electrodes, or to cease supplying a trigger voltage to the electrodes, when the controller 402 detects a data load, such as a data load that exceeds a threshold, at the other component 414 or when the controller 402 detects that a data load being processed by the other component 414 is greater than a data load being processed by the component 412.

In another embodiment, the controller 402 can be adapted to cause a voltage received at the cooling fluid guides 410 to change in proportion to a change in data load processed at the other component 414. The controller 402 can be adapted to detect a threshold data load processed at the other component 414 or a greater data load processed at the other component than at the component 412, before causing the voltage received at the cooling fluid guides 410 to change. The controller 402 can be adapted to increase or decrease the voltage received by the cooling fluid guides 410 in response to an increase in data load processed at the other component 414, and to decrease or increase the voltage received by the cooling fluid guides 410 in response to a decrease in data load processed at the other component 414.

Figure 5:
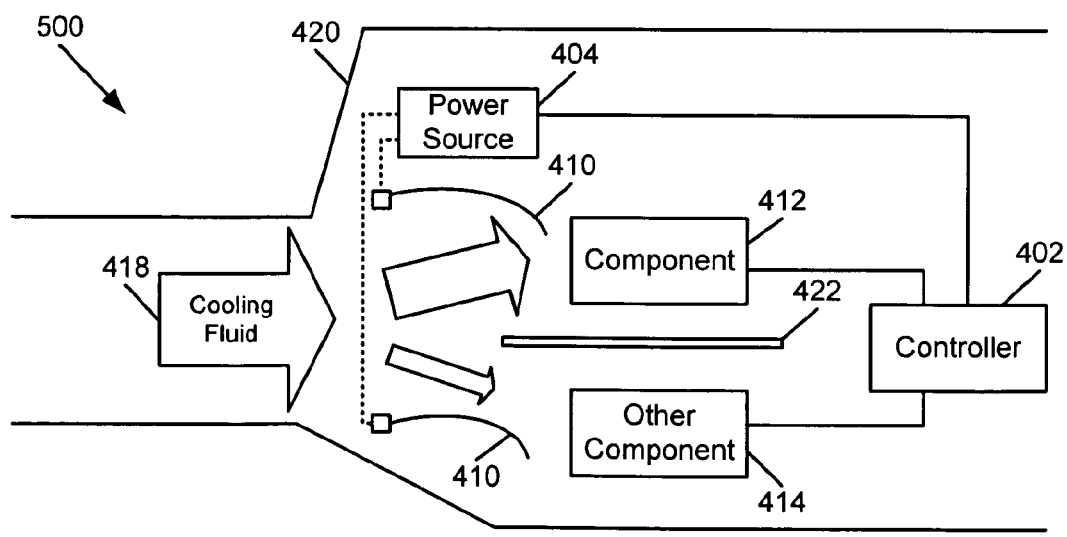
FIG. 5 is a block diagram illustrating yet another particular embodiment of a system to dissipate heat in an information handling system.
Figure 6:
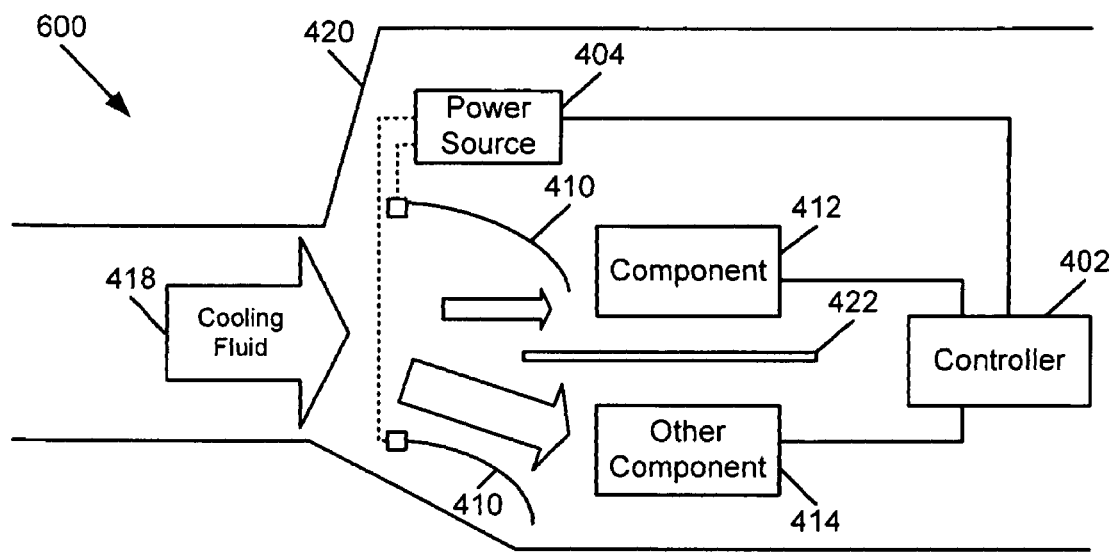
FIG. 6 is a block diagram illustrating still another particular embodiment of a system to dissipate heat in an information handling system.

The cooling fluid guides 410 can be adapted to change to another shape, as illustrated in FIG. 5, in response to receiving, or receiving less than, the trigger voltage via the electrodes. An increased portion of the cooling fluid 418 is directed toward the other component 414, when the cooling fluid guides 410 are in a form of the other shape. In addition, the cooling fluid guides 410 can be adapted to change to yet another shape, as illustrated in FIG. 6, in response to receiving an even greater voltage (or a further reduced voltage, where receiving less than the trigger voltage causes the previous change) via the electrodes. As a result, the cooling fluid guides 410 can be adapted to change shape substantially continuously within a range of voltages, and the proportion of cooling fluid 418 that is directed toward the power supply 414 can be increased or decreased in proportion to the voltage supplied to the electrodes (and, hence, the data load processed by the other component 414), in contrast to the cooling fluid guide 410 only assuming one shape or another without regard to the amount of voltage received.

The supply of the trigger voltage to the cooling fluid guides 410 can be terminated (or reapplied) when the controller 402 determines, for example, that the data load processed at the other component 414 falls below a threshold or when the controller 402 determines that a data load processed at the component 412 meets or exceeds the data load processed at the other component 414. For instance, the controller 402 can be adapted to signal the power source 404 to stop supplying the trigger voltage to a cooling fluid guide 410, can be adapted to signal the power source 404 to supply another voltage to a cooling fluid guide 410, can be adapted to cause a cooling fluid guide 410 to not receive the trigger voltage, or a combination thereof. Alternatively, the controller 402 can be adapted to cause the voltage received by the cooling fluid guides 410 to be reduced (or increased) in proportion to decreases in data load processed at the other component 414.

Figure 7:
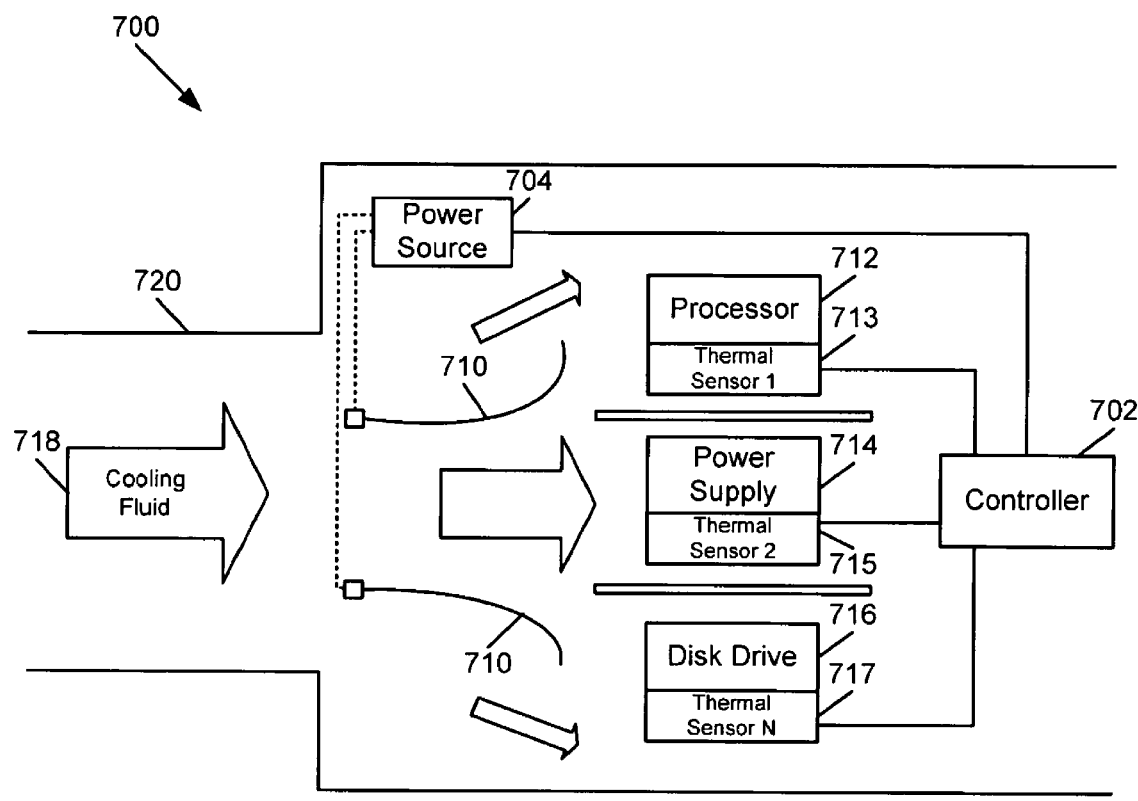
FIG. 7 is a block diagram illustrating an additional particular embodiment of a system to dissipate heat in an information handling system.

FIG. 7 illustrates an additional embodiment of a system 700 to dissipate heat in an information handling system. The system 700 includes a controller 702 coupled to a power source 704. The power source 704 is adapted to supply an electrical voltage to a plurality of electrodes, each of which is coupled to one of a plurality of cooling fluid guides 710. Each cooling fluid guide 710 is formed of a flexible electroactive material, such as an electroactive polymer.

The controller 702 is also coupled to a heat-generating component of the information handling system, such as the processor 712, which includes a thermal sensor 713. The controller 702 can be coupled to another heat-generating component of the information handling system, such as the power source 714 or the disk drive 716, each of which includes a thermal sensor, such as the thermal sensor 715 or the thermal sensor 717. In one embodiment, the thermal sensors 713, 715, and 717 can be coupled to the respective heat-generating components 712, 714, and 716 and the controller 702 can be coupled to the thermal sensors 713, 715, and 717. In another embodiment, the thermal sensors 713, 715, and 717 can be integrated with the respective heat-generating components 712, 714, and 716 and the controller 702 can be coupled to the heat-generating components 712, 714, and 716.

In an illustrative embodiment, the components 712, 714, and 716 can be separated by partitions that effectively divide a chamber 720 or other partially enclosed portion of the information handling system into a plurality of channels, each channel adapted to direct cooling fluid 718 toward one of the components 712, 714, or 716. The cooling fluid guides 710 can be in a form of a shape (not shown) that directs substantially equal portions of the cooling fluid 718 toward the components 712, 714, and 716.

The controller 702 can be adapted to actively obtain or passively receive temperature data from the thermal sensors 713, 715, and 717 in near real-time or at periodic intervals. The controller 702 can be adapted to cause the cooling fluid guides 710 to receive, or no longer receive, a trigger voltage when the controller 702 determines that a temperature detected at a component is at or above a threshold temperature or determines that a temperature at a component is greater than temperatures at the other components. For example, the controller 702 can signal the power source 704 to supply a trigger voltage to the electrodes.

In another embodiment, the controller 702 can be adapted to cause a voltage received at the cooling fluid guides 710 to change in proportion to a change in temperature at the power supply 714, for example. The controller 702 can be adapted to detect a threshold temperature at the power supply 714 or a greater temperature at the power supply 714 than at the other components, before causing the voltage received at the cooling fluid guides 710 to change. The controller 702 can be adapted to increase or decrease the voltage received by the cooling fluid guides 710 in response to an increase in temperature at the power supply 714, and to decrease or increase the voltage received by the cooling fluid guides 710 in response to a decrease in temperature at the power supply 714.

The cooling fluid guides 710 can each be adapted to change to another shape, as illustrated in FIG. 7, when the power source 704 supplies the trigger voltage to the electrodes. As illustrated in FIG. 7, the cooling fluid guides 710 can each be adapted to change to another shape that is different from the other shape of another of the cooling fluid guides 710. In one example, a larger portion of the cooling fluid 718 can be directed toward the power supply 714, than toward the processor 712 or the disk drive 714, when the cooling fluid guides 710 are in forms of the other shapes in response to the trigger voltage.

In another embodiment, the cooling fluid guides 710 can be adapted to change to yet additional shapes (not shown), in response to receiving an even greater voltage (or a further reduced voltage, where receiving less than the trigger voltage causes the previous change) via the electrodes. As a result, the cooling fluid guides 710 can be adapted to change shape substantially continuously within a range of voltages, and the proportion of cooling fluid 718 that is directed toward the power supply 714 can be increased or decreased in proportion to the voltage supplied to the electrodes (and, hence, the temperature of the power supply 714), in contrast to the cooling fluid guide 710 only assuming one shape or another without regard to the amount of voltage received.

The supply of the trigger voltage to the cooling fluid guides 710 can be terminated (or reapplied) when the controller 702 determines, for example, that the temperature at the power supply 714 falls below a threshold or when the controller 702 determines that a temperature at the processor 712 or the disk drive 716 meets or exceeds the temperature at the power supply 714. The controller 702 can be adapted to signal the power source 704 to stop supplying the trigger voltage to a cooling fluid guide 710, can be adapted to signal the power source 704 to supply another voltage to a cooling fluid guide 710, can be adapted to otherwise prevent a cooling fluid guide 710 from receiving the trigger voltage, or a combination thereof, when the controller 702 determines that the temperature at the power supply 714 falls below a threshold or falls below a temperature at the processor 712, a temperature at the disk drive 716, or a combination thereof. Alternatively, the controller 702 can be adapted to cause the voltage received by the cooling fluid guides 710 to be reduced (or increased) in proportion to decreases in temperature at the power supply 714.

Figure 8:
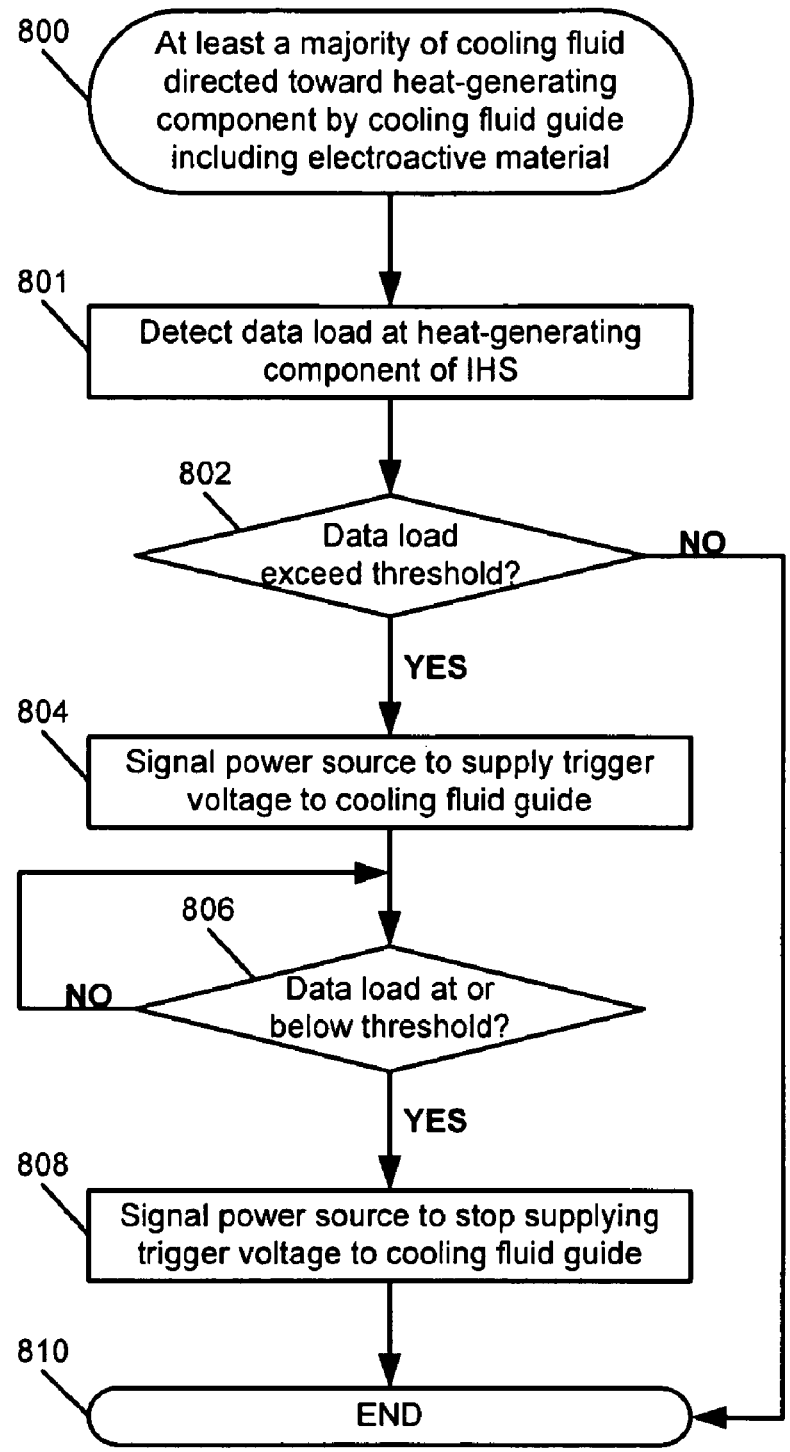
FIG. 8 is a flow diagram illustrating a particular embodiment of a method of dissipating heat in an information handling system.

FIG. 8 illustrates a particular embodiment of a method of dissipating heat in an information handling system. At 800, at least a majority of cooling fluid is directed toward a heat-generating component of an information handling system by a cooling air guide that includes an electroactive material. At block 801, a controller detects a data load processed at another heat-generating component of the information handling system. Moving to decision node 802, in a particular embodiment, the controller determines whether the data load exceeds a threshold. For example, the controller can determine whether the data load exceeds zero bytes of data processed per second or another number of bytes of data processed per second.

If the controller determines that the data load processed at the other heat-generating component exceeds the threshold, the method proceeds to block 804, and the controller signals a power source to supply a trigger voltage to the cooling fluid guide. The cooling fluid guide is adapted to change from a shape to another shape in response to the trigger voltage. As a result, an increased portion of cooling fluid is directed toward the other heat-generating component when the cooling fluid guide is in a form of the other shape, than when the cooling fluid guide is in a form of the shape.

Continuing to decision node 806, the controller can determine whether the data load processed at the other heat-generating component is at or below the threshold. If the controller determines that the data load at the other heat-generating component is at or below the threshold data load, the method advances to block 808, and the controller signals the power source to stop supplying the trigger voltage to the cooling fluid guide, where the cooling fluid guide is adapted to return to the shape prior to receiving the trigger voltage, when the cooling fluid guide no longer receives the trigger voltage. The method terminates at 810.

Figure 9:
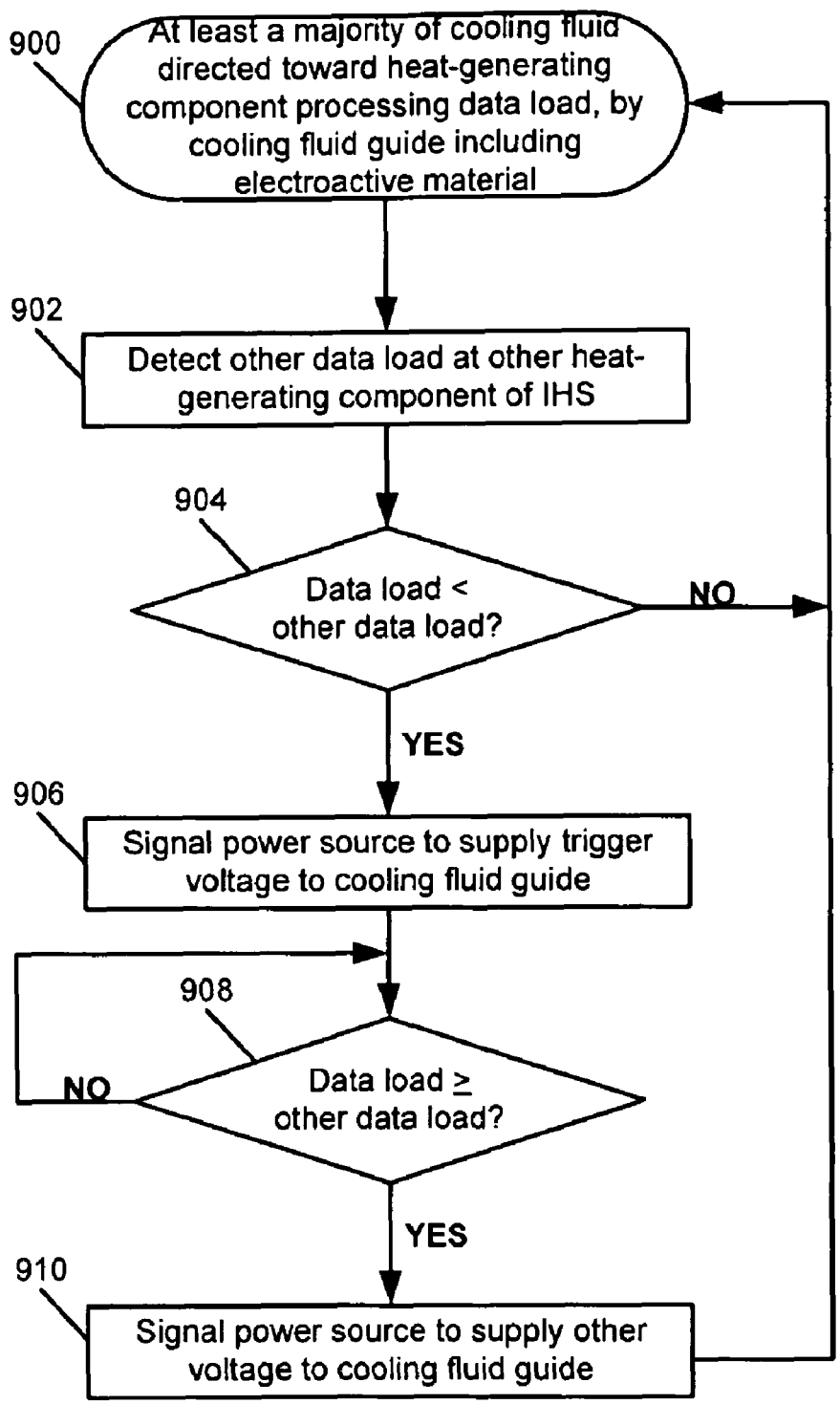
FIG. 9 is a flow diagram illustrating another particular embodiment of a method of dissipating heat in an information handling system.

FIG. 9 illustrates another particular embodiment of a method of dissipating heat in an information handling system. At 900, at least a majority of cooling fluid is directed toward a heat-generating component of an information handling system by a cooling air guide that includes an electroactive material. The heat-generating component is handling a data load. At block 902, a controller detects another data load at another heat-generating component of the information handling system. Moving to decision node 904, the controller determines whether the data load is less than the other data load. If the controller determines that the data load equals or exceeds the other data load, the method returns to 900.

Conversely, if the controller determines that the data load is less than the other data load, the method proceeds to block 906, and the controller signals a power source to supply a trigger voltage to the cooling fluid guide. The cooling fluid guide is adapted to change from a shape to another shape in response to the trigger voltage. When the cooling fluid guide is in a form of the other shape, the cooling fluid guide directs an increased portion of cooling fluid toward the other heat-generating component.

Continuing to decision node 908, the controller can determine whether the data load at the heat-generating component equals or exceeds the other data load at the other heat-generating component. If the controller determines that the data load at the heat-generating component equals or exceeds the other data load at the other heat-generating component, the method advances to block 910, and the controller signals the power source to supply another voltage to the cooling fluid guide, where the cooling fluid guide is adapted to return to the shape prior to receiving the trigger voltage, in response to the other voltage. The method can then return to 900.

Figure 10:
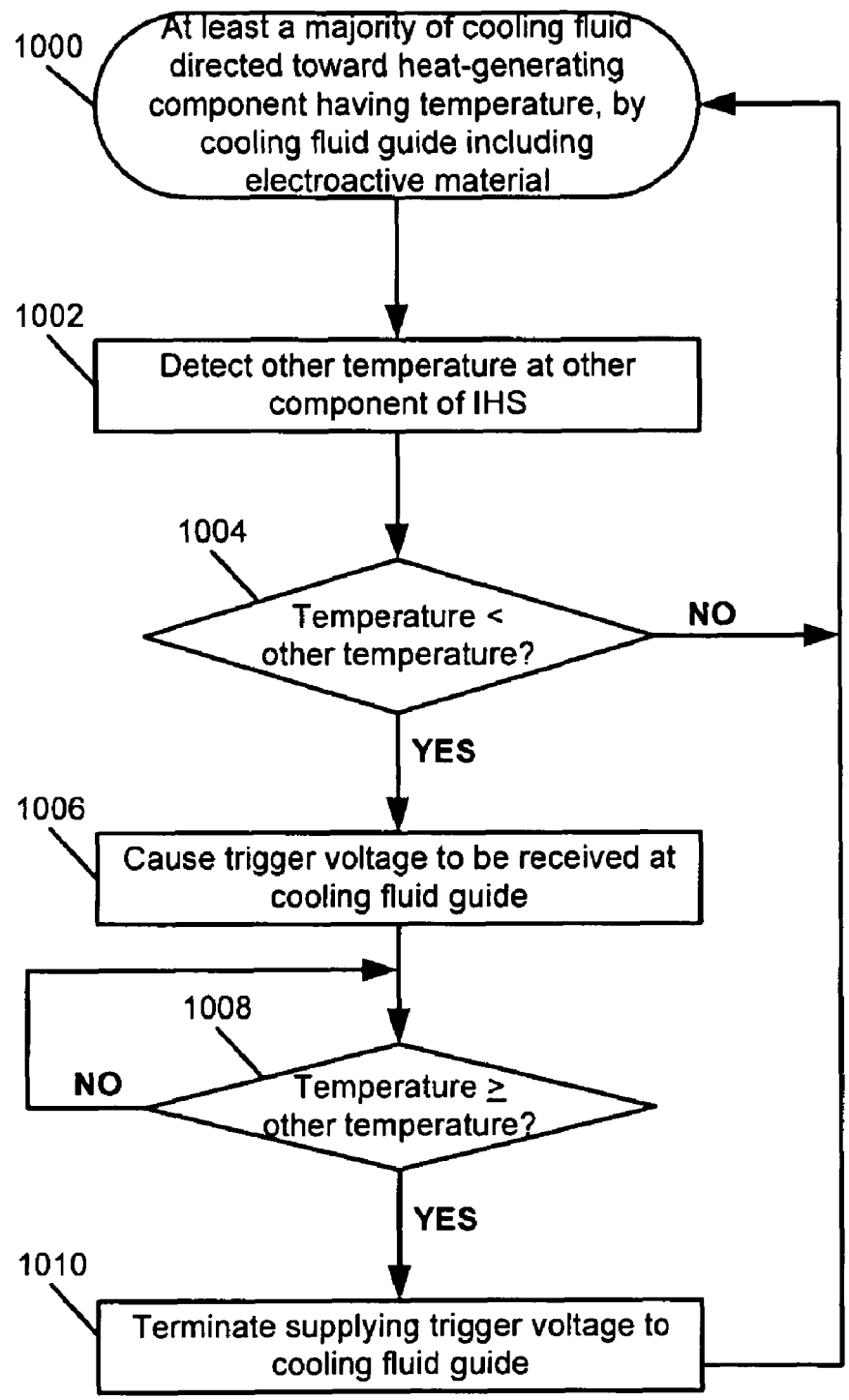
FIG. 10 is a flow diagram illustrating a further particular embodiment of a method of dissipating heat in an information handling system.

FIG. 10 illustrates a further particular embodiment of a method of dissipating heat in an information handling system. At 1000, at least a majority of cooling fluid is directed toward a heat-generating component of an information handling system by a cooling air guide that includes an electroactive material. The heat-generating component has a temperature. At block 1002, a controller detects another temperature at another heat-generating component of the information handling system. Moving to decision node 1004, the controller determines whether the temperature is less than the other temperature. If the controller determines that the temperature equals or exceeds the other temperature, the method returns to 1000.

Conversely, if the controller determines that the temperature is less than the other temperature, the method proceeds to block 1006, and the controller causes a trigger voltage to be received at the cooling fluid guide. For example, the controller can cause a gate to allow a trigger voltage emitted by a power source to be received at the cooling fluid guide. The cooling fluid guide is adapted to change from a shape to another shape in response to the trigger voltage. The cooling fluid guide directs an increased portion of cooling fluid toward the other heat-generating component, when the cooling fluid guide is in a form of the other shape. In one embodiment, the cooling fluid guide can direct a larger portion of the cooling fluid toward the heat-generating component when the cooling fluid guide is in a form of the shape prior to receiving the trigger voltage, and can direct a larger portion of the cooling fluid toward the other heat-generating component, when the cooling fluid guide is in the form of the other shape.

Continuing to decision node 1008, the controller can determine whether the temperature at the heat-generating component equals or exceeds the other temperature at the other heat-generating component. If the controller determines that the temperature at the heat-generating component equals or exceeds the other temperature at the other heat-generating component, the method advances to block 1010, and the supply of the trigger voltage to the cooling fluid guide can be terminated. For example, the controller can cause the gate to prevent the trigger voltage from being received at the cooling fluid guide. The method can then return to 1000.

Figure 11:
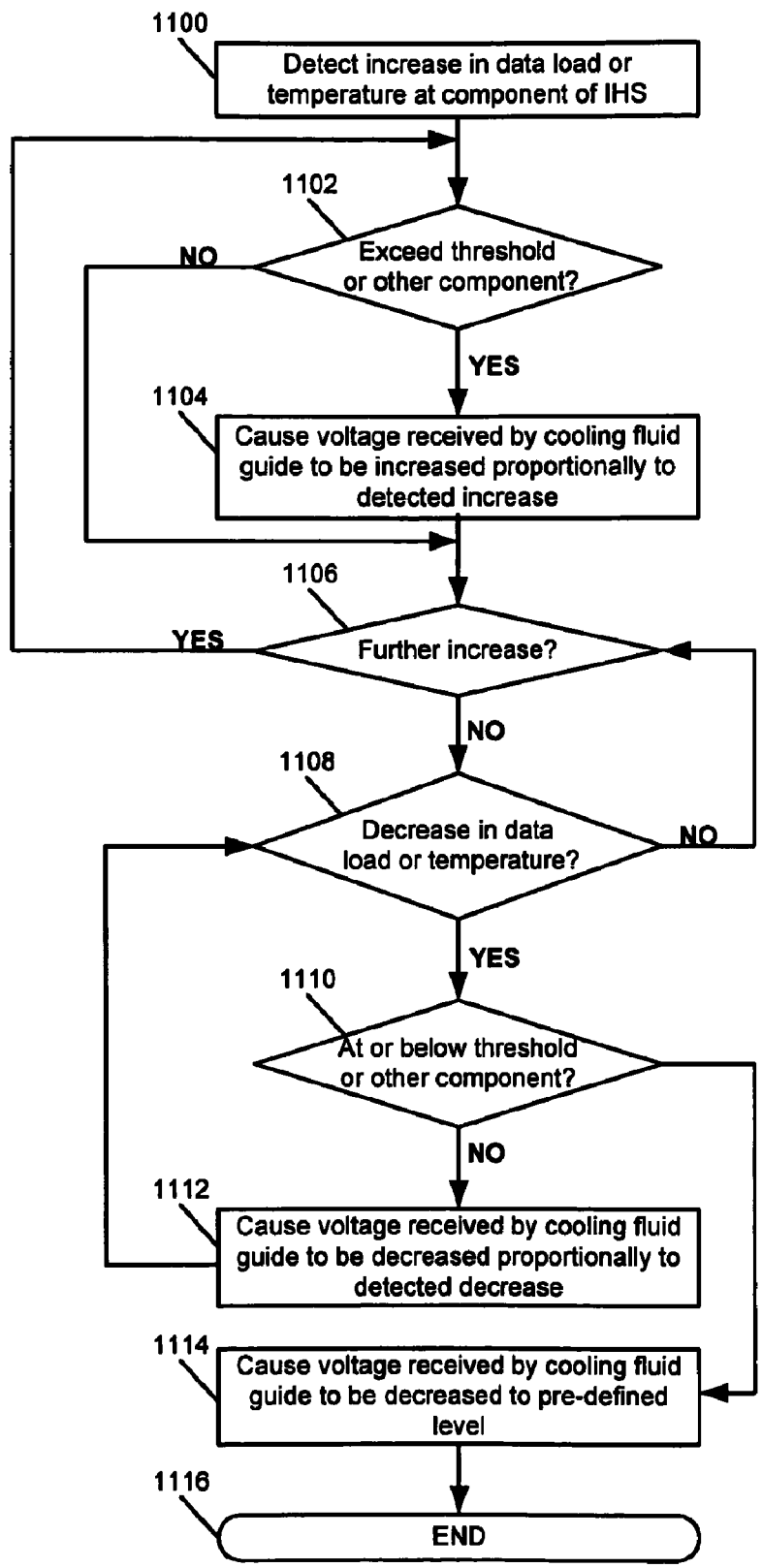
FIG. 11 is a flow diagram illustrating an additional particular embodiment of a method of dissipating heat in an information handling system.

FIG. 11 illustrates an additional particular embodiment of a method of dissipating heat in an information handling system. At block 1100, a controller detects an increase in data load or temperature at a component of an information handling system. Moving to decision node 1102, in a particular embodiment, the controller can determine whether the increased data load or temperature exceeds a threshold data load or temperature or exceeds a data load or temperature at another component of the information handling system. If not, the method can proceed to decision node 1106. Conversely, if the increased data load or temperature exceeds a threshold data load or temperature, the method proceeds to block 1104, and the controller causes a voltage received by a cooling fluid guide to be increased proportionally to the detected increase in data load or temperature at the component.

Continuing to decision node 1106, the controller determines whether it has detected a further increase in data load or temperature at the component. If so, the method returns to decision node 1102. Whereas, if the controller has not detected a further increase, the method advances to decision node 1108, and the controller determines whether it has detected a decrease in data load or temperature at the component. If the controller has not detected a decrease, the method can return to decision node 1106. On the other hand, if the controller has detected a decrease in data load or temperature at the component, in a particular embodiment, the method moves to decision node 1110.

At decision node 1110, the controller determines whether the data load or temperature is at or below a threshold, or at or below a data load or temperature at another component, after the detected decrease. If not, the method proceeds to block 1112, and the controller causes the voltage received by the cooling fluid guide to be decreased proportionally to the detected decrease in data load or temperature at the component. The method then returns to decision node 1108. Returning to decision node 1110, in an illustrative embodiment, if the controller determines that the data load or temperature is at or below a threshold, or at or below a data load or temperature at another component, after the detected decrease, the method proceeds to block 1114, and the controller can cause the voltage received by the cooling fluid guide to be decreased to a pre-defined level. The method can terminate at 1116.

In other embodiments of the method disclosed with respect to FIG. 11, the controller can cause a voltage received by the cooling fluid guide to be decreased proportionally to an increase in data load or temperature, and to cause the voltage to be increased proportionally or raised to a pre-defined level, in response to a decrease in data load or temperature.

In some embodiments, the methods disclosed herein can be performed as described. In other embodiments, certain aspects of the methods can be performed in alternative sequences or simultaneously.

Many different aspects and embodiments are possible. Some of those aspects and embodiments are described below. After reading this specification, skilled artisans will appreciate that those aspects and embodiments are only illustrative and do not limit the scope of the present invention. For example, in one embodiment, a cooling fluid guide can be in a form of a shape, such as a neutral shape, when no trigger voltage is received; can be in a form of another shape when a positive trigger voltage (+V) is received; and can be in a form of a further shape, such as a shape substantially opposite the other shape, when a negative trigger voltage (−V) is received.

The cooling fluid guide can be adapted to change substantially continuously between the neutral shape and the other shape within voltage ranges of zero to +V, and to change substantially continuously between the neutral shape and the further shape within voltage ranges of zero to −V.

According to a first aspect, a system to dissipate heat in an information handling system includes a first heat-generating component adapted to process first data and a second heat-generating component adapted to process second data. The system also includes a cooling fluid guide including an electroactive material. The cooling fluid guide is adapted to change from a first shape to a second shape, in response to receiving a trigger voltage or in response to no longer receiving the trigger voltage. The system also includes a controller adapted to detect a data load processed at the second heat-generating component and, in response to detecting the data load, to cause the trigger voltage to be received at, or no longer received at, the cooling fluid guide. The cooling fluid guide is adapted to direct an increased portion of cooling fluid toward the first heat-generating component when the cooling fluid guide is in a form of the second shape, as compared to the first shape.

In an embodiment of the first aspect, the cooling fluid guide is adapted to direct a larger portion of the cooling fluid toward the first heat-generating component, than toward the second heat-generating component, when in a form of the first shape, and to direct a larger portion of the cooling fluid toward the second heat-generating component, than toward the first heat-generating component, when in the form of the second shape. In another embodiment of the first aspect, the cooling fluid can include a gas, a liquid or a gel.

In another embodiment of the first aspect, the controller is adapted to signal a power source to supply the trigger voltage, or to cease supplying the trigger voltage, after determining that the data load processed at the second heat-generating component exceeds a threshold. In a further embodiment of the first aspect, the controller is adapted to signal a power source to supply the trigger voltage, or to cease supplying the trigger voltage, after determining that the data load processed at the second heat-generating component exceeds a first data load processed at the first heat-generating component.

In an additional embodiment of the second aspect, the system includes a first electrode coupled to a first end of the cooling fluid guide and a second electrode coupled to a second end of the cooling fluid guide. The power source supplies the particular voltage to the cooling fluid guide by creating an electrical voltage difference between the first electrode and the second electrode.

In yet another embodiment of the first aspect, the system includes a plurality of channels separated by the cooling fluid guide. A first channel is adapted to conduct a portion of the cooling fluid toward the first heat-generating component, and a second channel is adapted to conduct another portion of the cooling fluid toward the second heat-generating component.

In still another embodiment of the first aspect, the system includes a cooling fluid source adapted to drive a substantially constant amount of cooling fluid toward the plurality of channels, and the cooling fluid guide divides the substantially constant amount of cooling fluid between the plurality of channels based on the shape of the cooling fluid guide.

In another embodiment of the first aspect, the electroactive material comprises an electroactive polymer, such as an electronic electroactive polymer, an ionic electroactive polymer, or a combination thereof. For example, the electroactive polymer can include an electrorestrictive polymer, a dielectric elastomer, an electrostatic polymer, a ferroelectric polymer, a piezoelectric polymer, a conductive polymer, an ionic polymer-metal composite, a carbon nanotube, a responsive gel, or a combination thereof.

According to a second aspect, a system to dissipate heat in an information handling system includes a first heat-generating component coupled to a first temperature sensor and a second heat-generating component coupled to a second temperature sensor. The system also includes a cooling fluid guide comprising an electroactive material. The cooling fluid guide is adapted to change from a first shape to a second shape, in response to receiving a trigger voltage or in response to no longer receiving the trigger voltage. The system also includes a controller adapted to cause the trigger voltage to be received at, or no longer received at, the cooling fluid guide when a greater temperature is detected at the first temperature sensor than at the second temperature sensor. The cooling fluid guide is adapted to direct an increased portion of cooling fluid toward the first heat-generating component when the cooling fluid guide is in a form of the second shape, as compared to the first shape.

In one embodiment of the second aspect, the system includes another cooling fluid guide adapted to change to a third shape in response to receiving, or no longer receiving the trigger voltage. The other cooling fluid guide is adapted to direct an increased portion of the cooling fluid toward the second heat-generating component when in a form of the third shape, than when in a form of a fourth shape. In another embodiment of the second aspect, the heat-generating component comprises a data processing component, a disk drive or a power supply.

According to a third aspect, a method of dissipating heat in an information handling system includes detecting a change in a data load or a temperature at a heat-generating component of the information handling system and, in response to detecting the change in the data load or temperature, causing a voltage received at a cooling fluid guide to change in proportion to the change in the data load or temperature. The cooling fluid guide comprises an electroactive material adapted to change shape in proportion to a change in the voltage received. Further, the cooling fluid guide changes a proportion of cooling fluid flowing toward the heat-generating component when the cooling fluid guide changes shape.

In an embodiment of the third aspect, causing the cooling fluid guide is adapted to change shape substantially continuously when the voltage received is changed within a range of voltages. In a further embodiment of the third aspect, the method includes determining that the data load exceeds another data load processed at another heat-generating component before causing the voltage received by the cooling fluid guide to change. In still another embodiment of the third aspect, the method can include determining that the data load exceeds a threshold before causing the voltage received by the cooling fluid guide to change.

In another embodiment of the third aspect, the controller is adapted to increase the voltage received at the cooling fluid guide in proportion to increasing data load or temperature at the heat-generating component. In an additional embodiment of the third aspect, the controller is adapted to decrease the voltage received at the cooling fluid guide in proportion to increasing data load or temperature at the heat-generating component.

Note that not all of the activities described above in the general description or the examples are required, that a portion of a specific activity may not be required, and that one or more further activities may be performed in addition to those described. Still further, the order in which activities are listed are not necessarily the order in which they are performed.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system to dissipate heat in an information handling system, the system comprising:
    a first heat-generating component adapted to process first data;
    a second heat-generating component adapted to process second data;
    a cooling fluid guide comprising an electroactive material, wherein the cooling fluid guide is adapted to change from a first shape to a second shape in response to receiving a trigger voltage, and to change from the second shape to the first shape in response to no longer receiving the trigger voltage; and
    a controller adapted to detect a data load processed at the second heat-generating component and, in response to detecting the data load, to change the trigger voltage the cooling fluid guide, wherein the controller decreases the trigger voltage in proportion to increasing data load at the heat-generating component;
    wherein the cooling fluid guide is adapted to direct an increased portion of cooling fluid away from the first heat-generating component and toward the second heat-generating component when the cooling fluid guide is in a form of the second shape, as compared to the first shape;
    wherein the controller signals a power source to supply the trigger voltage after determining that a second data load processed at the second heat-generating component exceeds a first data load processed at the first heat-generating component.

2. The system of claim 1, wherein the cooling fluid guide is adapted to direct a larger portion of the cooling fluid toward the first heat-generating component, than toward the second heat-generating component, when in a form of the first shape, and to direct a larger portion of the cooling fluid toward the second heat-generating component, than toward the first heat-generating component, when in the form of the second shape.

3. The system of claim 1, wherein the cooling fluid comprises at least one of a gas, a liquid, and a gel.

4. The system of claim 1, wherein the controller is adapted to signal a power source to supply the trigger voltage after determining that the data load processed at the second heat-generating component exceeds a threshold.

5. The system of claim 1, further comprising a first electrode coupled to an end of the cooling fluid guide and a second electrode coupled to another end of the cooling fluid guide, wherein the power source supplies the particular voltage to the cooling fluid guide by creating a voltage difference between the first electrode and the second electrode.

6. The system of claim 1, further comprising a plurality of channels separated by the cooling fluid guide, wherein a first channel is adapted to conduct a portion of the cooling fluid toward the first heat-generating component, and wherein a second channel is adapted to conduct another portion of the cooling fluid toward the second heat-generating component.

7. The system of claim 6, wherein a cooling fluid source is adapted to drive a substantially constant amount of cooling fluid, and wherein the cooling fluid guide divides the substantially constant amount of cooling fluid between the plurality of channels based on the shape of the cooling fluid guide.

8. The system of claim 1, wherein the electroactive material comprises an electroactive polymer.

9. The system of claim 8, wherein the electroactive polymer comprises at least one of an electronic electroactive polymer and an ionic electroactive polymer.

10. The system of claim 9, wherein the electroactive polymer comprises at least one of an electrorestrictive polymer, a dielectric elastomer, an electrostatic polymer, a ferroelectric polymer, a piezoelectric polymer, a conductive polymer, an ionic polymer-metal composite, a carbon nanotube, and a responsive gel.

11. A system to dissipate heat in an information handling system, the system comprising:
a first heat-generating component coupled to a first temperature sensor;
a second heat-generating component coupled to a second temperature sensor;
a cooling fluid guide comprising an electroactive material, wherein the cooling fluid guide is adapted to change from a first shape to a second shape in response to receiving a trigger voltage, and to change from the second shape to the first shape in response to no longer receiving the trigger voltage; and
a controller adapted to cause the trigger voltage to be received at the cooling fluid guide when a first temperature is detected at the first temperature sensor is less than a second temperature detected at the second temperature sensor, and to cause the trigger voltage to be no longer received at the cooling fluid guide when the first temperature is greater than the second temperature;
wherein the cooling fluid guide is adapted to direct a first increased portion of cooling fluid away from the first heat-generating component and toward the second heat-generating component when the cooling fluid guide is in a form of the second shape, as compared to the first shape; and
wherein the controller signals a power source to supply the trigger voltage after determining that a second data load processed at the second heat-generating component exceeds a first data load processed at the first heat-generating component.

12. The system of claim 11, further comprising another cooling fluid guide adapted to change from a third shape to a fourth shape in response to receiving the trigger voltage, and to change from the fourth shape to the third shape in response to no longer receiving the trigger, wherein the other cooling fluid guide is adapted to direct a second increased portion of the cooling fluid away from the first heat-generating component and toward the second heat-generating component when in a form of the fourth shape, as compared to the third shape.

13. The system of claim 11, wherein the first heat-generating component comprises a data processing component, a disk drive or a power supply.

14. A method of dissipating heat in an information handling system, the method comprising:
detecting a change in a data load at a heat-generating component of the information handling system; and
in response to detecting the change in the data load, causing a voltage received at a cooling fluid guide to change in proportion to the change in the data load or temperature;
wherein the cooling fluid guide comprises an electroactive material adapted to change shape in proportion to a change in the voltage received, and wherein the cooling fluid guide changes a proportion of cooling fluid flowing toward the heat-generating component when the cooling fluid guide changes shape;
wherein the controller decreases the voltage received at the cooling fluid guide in proportion to increasing data load at the heat-generating component.

15. The method of claim 14, wherein the cooling fluid guide is adapted to change shape substantially continuously when the voltage received is changed within a range of voltages.

16. The method of claim 14, further comprising determining that the data load exceeds another data load processed at another heat-generating component before causing the voltage received by the cooling fluid guide to change.

17. The method of claim 14, further comprising determining that the data load exceeds a threshold before causing the voltage received by the cooling fluid guide to change.

* * * * *